US010908188B2

(12) United States Patent
Laurino et al.

(10) Patent No.: US 10,908,188 B2
(45) Date of Patent: Feb. 2, 2021

(54) FLEXIBLE JAW PROBE FOR NON-CONTACT ELECTRICAL PARAMETER MEASUREMENT

(71) Applicant: Fluke Corporation, Everett, WA (US)

(72) Inventors: Ferdinand Y. Laurino, Seattle, WA (US); Jeffrey Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 308 days.

(21) Appl. No.: 15/977,148

(22) Filed: May 11, 2018

(65) Prior Publication Data

US 2019/0346487 A1 Nov. 14, 2019

(51) Int. Cl.
*G01R 15/18* (2006.01)
*G01R 15/20* (2006.01)
*G01R 19/00* (2006.01)

(52) U.S. Cl.
CPC ......... *G01R 15/186* (2013.01); *G01R 15/181* (2013.01); *G01R 15/202* (2013.01); *G01R 15/205* (2013.01); *G01R 19/00* (2013.01)

(58) Field of Classification Search
CPC ........ G01R 1/22; G01R 15/186; G01R 15/16; G01R 15/202; G01R 19/00; G01R 15/181; G01R 15/205; G01R 15/12; G01R 15/14; G01R 1/04; G01R 15/18; G01R 15/20

See application file for complete search history.

(56) References Cited

U.S. PATENT DOCUMENTS

| 3,434,052 A | 3/1969 | Féchant |
| 5,473,244 A | 12/1995 | Libove et al. |
| 5,583,444 A | 12/1996 | Nakamura et al. |

(Continued)

FOREIGN PATENT DOCUMENTS

| CN | 2639905 Y | 9/2004 |
| DE | 199 62 323 A1 | 7/2001 |

(Continued)

OTHER PUBLICATIONS

Extended European Search Report for EP application No. 19173650.3 dated Sep. 26, 2019, 13 pages.

(Continued)

*Primary Examiner* — Jermele M Hollington
*Assistant Examiner* — Suresh K Rajaputra
(74) *Attorney, Agent, or Firm* — Seed Intellectual Property Law Group LLP (57) ABSTRACT

Systems and methods are provided for measuring electrical parameters in an insulated conductor without requiring a galvanic connection. A sensor probe is provided that includes a body and a flexible arm or strap that is movable between an open position that allows a conductor to be moved into and out of a measurement area of the probe, and a closed position that secures the insulated conductor within the measurement area so that one or more measurements may be obtained. The electrical parameter sensor probe may include a non-contact sensor coupled to at least one of the body or the flexible arm. A user may apply a force to an actuator (e.g., slide switch) which moves the flexible arm from the closed position into the open position against a bias force so that the insulated conductor under test may be positioned and secured in the measurement area of the sensor probe.

20 Claims, 5 Drawing Sheets

(56) References Cited

U.S. PATENT DOCUMENTS

| | | | |
|---|---|---|---|
| 5,973,501 A | 10/1999 | Reichard | |
| 6,014,027 A | 1/2000 | Reichard | |
| 6,043,640 A | 3/2000 | Lauby et al. | |
| 6,118,270 A | 9/2000 | Singer et al. | |
| 6,456,060 B1 * | 9/2002 | Wiesemann | G01R 1/22 |
| | | | 324/127 |
| 6,644,636 B1 | 11/2003 | Ryan | |
| 6,664,708 B2 | 12/2003 | Schlimak et al. | |
| 6,812,685 B2 | 11/2004 | Steber et al. | |
| 6,825,649 B2 | 11/2004 | Nakano | |
| 7,084,643 B2 | 8/2006 | Howard et al. | |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,680,845 B2 | 3/2014 | Carpenter et al. | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 2002/0167303 A1 | 11/2002 | Nakano | |
| 2007/0086130 A1 | 4/2007 | Sorensen | |
| 2009/0058398 A1 | 3/2009 | Ibuki | |
| 2010/0060300 A1 | 3/2010 | Müller et al. | |
| 2010/0090682 A1 | 4/2010 | Armstrong | |
| 2010/0134094 A1 * | 6/2010 | Shah | G01R 1/22 |
| | | | 324/126 |
| 2010/0283539 A1 | 11/2010 | Yanagisawa | |
| 2012/0200291 A1 | 8/2012 | Carpenter et al. | |
| 2012/0259565 A1 | 10/2012 | Oshima et al. | |
| 2012/0290240 A1 | 11/2012 | Fukui | |
| 2013/0076343 A1 | 3/2013 | Carpenter et al. | |
| 2013/0124136 A1 | 5/2013 | Neeley et al. | |
| 2013/0147464 A1 | 6/2013 | Tan | |
| 2014/0035607 A1 | 2/2014 | Heydron et al. | |
| 2014/0062459 A1 | 3/2014 | El-Essawy et al. | |
| 2015/0002138 A1 | 1/2015 | Fox | |
| 2015/0042320 A1 | 2/2015 | Cadugan et al. | |
| 2016/0047846 A1 | 2/2016 | Sharma et al. | |
| 2016/0080667 A1 | 3/2016 | Stuart et al. | |
| 2016/0109486 A1 | 4/2016 | Yanagisawa | |
| 2016/0116506 A1 | 4/2016 | Ringsrud | |
| 2016/0119592 A1 | 4/2016 | Stuart et al. | |
| 2017/0003320 A1 | 1/2017 | Tsujimoto | |

FOREIGN PATENT DOCUMENTS

| | | |
|---|---|---|
| EP | 1 249 706 B1 | 9/2007 |
| EP | 3 450 995 A1 | 3/2019 |
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |
| WO | 2017/220827 A1 | 12/2017 |

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from Galliana et al., "Traceable Technique to Calibrate Clamp Meters in AC Current From 100 to 1500 A," *IEEE Transactions on Instrumentation and Measurement* 61(9):2512-2518, 2012.

Hioki, "3258 : Safety HiTESTER," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," US. Appl. No. 62/068,392, filed Oct. 24, 2014, 9 pages.

Stuart et al., "Infrared Cameras Used as a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

* cited by examiner

FLEXIBLE JAW PROBE FOR NON-CONTACT ELECTRICAL PARAMETER MEASUREMENT

BACKGROUND

Technical Field

The present disclosure generally relates to electrical parameter measurement devices, and more particularly, to sensor probes for electrical parameter measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

BRIEF SUMMARY

An electrical parameter sensor probe operative to detect an electrical parameter in an insulated conductor without requiring galvanic contact with the insulated conductor may be summarized as including a body; a flexible arm coupled to the body, the flexible arm movable between a closed position and an open position, wherein, in the closed position, the flexible arm and a portion of the body form an enclosed measurement loop that defines a measurement area that receives the insulated conductor and, in the open position, the flexible arm opens at least a portion of the measurement loop to allow the insulated conductor to move into and out of the measurement area; an actuator operatively coupled to the flexible arm, in operation, responsive to actuation by a user the actuator moves the flexible arm from the closed position to the open position; and at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area. The actuator may bias the flexible arm in the closed position. The flexible arm may include a unitary structure that is deformable between the closed position and the opened position. The flexible arm may include a plurality of portions that are movable with respect to each other, and the actuator may be operative to move the portions relative to each other to move the flexible arm between the closed position and the open position. The plurality of portions may include links that are movable with respect to each other. The flexible arm may have a curved shape when the flexible arm is in the closed position, and the actuator may cause the flexible arm to straighten from the curved shape to be in the open position. The at least one non-contact sensor may include at least one of a non-contact voltage sensor or a non-contact current sensor. The at least one non-contact sensor may be coupled to the flexible arm. The at least one non-contact sensor may include at least one non-contact sensor coupled to the flexible arm and at least one non-contact sensor coupled to the body of the electrical parameter sensor probe.

The electrical parameter sensor probe may further include an interface connector operatively coupled to the at least one non-contact sensor, the interface connector being detachably coupleable to a corresponding interface connector of a main body of a non-contact electrical parameter measurement device. The at least one non-contact sensor may include at least one of a non-contact voltage sensor, a Hall Effect sensor, a fluxgate sensor, a Rogowski coil, an anisotropic magnetoresistance (AMR) sensor, or a giant magnetoresistance (GMR) sensor.

A device for measuring an electrical parameter in an insulated conductor may be summarized as including an electrical parameter sensor probe, including a body; a flexible arm coupled to the body, the flexible arm movable between a closed position and an open position, wherein, in the closed position, the flexible arm and a portion of the body form an enclosed measurement loop that defines a measurement area that receives the insulated conductor and, in the open position, the flexible arm opens at least a portion of the measurement loop to allow the insulated conductor to move into and out of the measurement area; an actuator operatively coupled to the flexible arm, in operation, responsive to actuation by a user the actuator moves the flexible arm from the closed position to the open position; and at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area; and control circuitry communicatively coupleable to the at least one non-contact sensor, in operation, the control circuitry: receives sensor data indicative of signals detected by the at least one non-contact sensor; and processes the received sensor data to determine at least one electrical parameter of the insulated conductor.

The device may further include a main body that contains the control circuitry. The main body may include at least one interface connector, and the electrical parameter sensor probe may be detachably connectable to the at least one interface connector of the main body.

The device may further include a main body that includes the electrical parameter sensor probe and the control circuitry. The control circuitry, in operation, may process the received sensor data to determine a voltage in the insulated conductor. The control circuitry, in operation, may process the received sensor data to determine a voltage and a current in the insulated conductor.

The device may further include a wireless communications subsystem operatively coupled to the control circuitry, in operation, the wireless communication subsystem wirelessly transmits the determined electrical parameter to an external system.

The device may further include a display that, in operation, visually presents the determined electrical parameter to a user of the device. The at least one non-contact sensor may include at least one of a non-contact voltage sensor, a Hall Effect sensor, a fluxgate sensor, a Rogowski coil, an anisotropic magnetoresistance (AMR) sensor, or a giant magnetoresistance (GMR) sensor.

A device for measuring an electrical parameter in an insulated conductor may be summarized as including a body; a flexible arm coupled to the body, the flexible arm movable between a closed position and an open position, wherein, in the closed position, the flexible arm and a portion of the body form an enclosed measurement loop that defines a measurement area that receives the insulated conductor and, in the open position, the flexible arm opens at least a portion of the measurement loop to allow the insulated conductor to move into and out of the measurement area; an actuator operatively coupled to the flexible arm, in operation, responsive to actuation by a user the actuator moves the flexible arm from the closed position to the open position; at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area; and control circuitry communicatively coupleable to the at least one non-contact sensor, in operation, the control circuitry: receives sensor data indicative of signals detected by the at least one non-contact sensor; processes the received sensor data to determine at least one electrical parameter of the insulated conductor; and provides the determined at least one electrical parameter to at least one of a user or an external device.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

One or more implementations of the present disclosure are directed to systems and methods for measuring electrical parameters (e.g., voltage, current, power) in an insulated or blank uninsulated conductor (e.g., insulated wire) without requiring a galvanic connection between the conductor and an electrical parameter sensor probe. Generally, a non-galvanic contact (or "non-contact") electrical parameter measurement system or device is provided which measures one or more electrical parameters in an insulated conductor. Such systems which do not require a galvanic connection are referred to herein as "non-contact." As used herein, "electrically coupled" includes both direct and indirect electrical coupling unless stated otherwise.

In at least some implementations, a non-contact, electrical parameter sensor probe is provided that is operative to accurately measure at least one of current and voltage in an insulated conductor under test. The sensor or jaw probe may be used to measure electrical parameters in conductors that have various shapes and sizes. The sensor probe includes a body and a flexible arm or strap coupled to the body that is movable between an open position that allows a conductor under test to be moved into and out of a measurement area of the sensor probe, and a closed position that secures the insulated conductor within the measurement area so that one or more measurements may be obtained. The electrical parameter sensor probe may include one or more non-contact sensors coupled to at least one of the body or the flexible arm. In operation, a user may apply a force to an actuator (e.g., slide switch) which moves the flexible arm from a normally closed position into an open position. The user may then position the electrical parameter sensor probe proximate the insulated conductor under test such that the conductor is positioned within the measurement area of the sensor probe. The user may then release the force, or apply a different force (e.g., in the opposite direction) to the actuator, which causes the flexible arm to return to the closed position, thereby securing the conductor within the measurement area of the sensor probe. Once measurements have been obtained, the user may again cause the flexible arm to move into the open position so that the insulated conductor can be removed from the measurement area. Particular features of the implementations of the present disclosure are discussed in detail below with reference to the figures.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
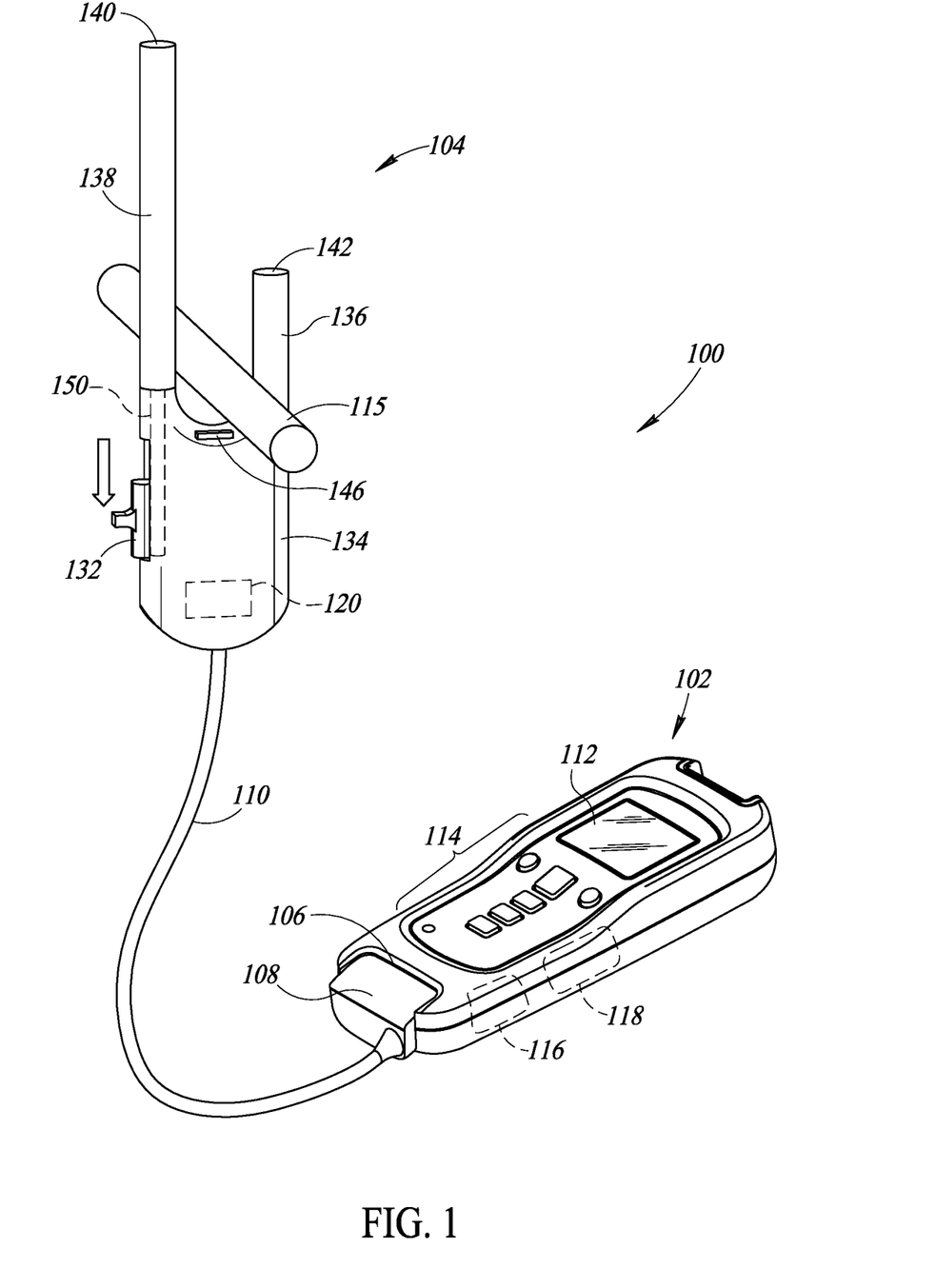
FIG. 1 is a pictorial diagram of an electrical parameter measurement device that includes an electrical parameter sensor probe that includes a flexible arm and a non-contact sensor, wherein the flexible arm is movable to form an enclosed measurement loop, shown with the measurement loop opened to allow an insulated conductor to be received for measurement within a measurement area, according to one non-limiting illustrated implementation.
Figure 2:
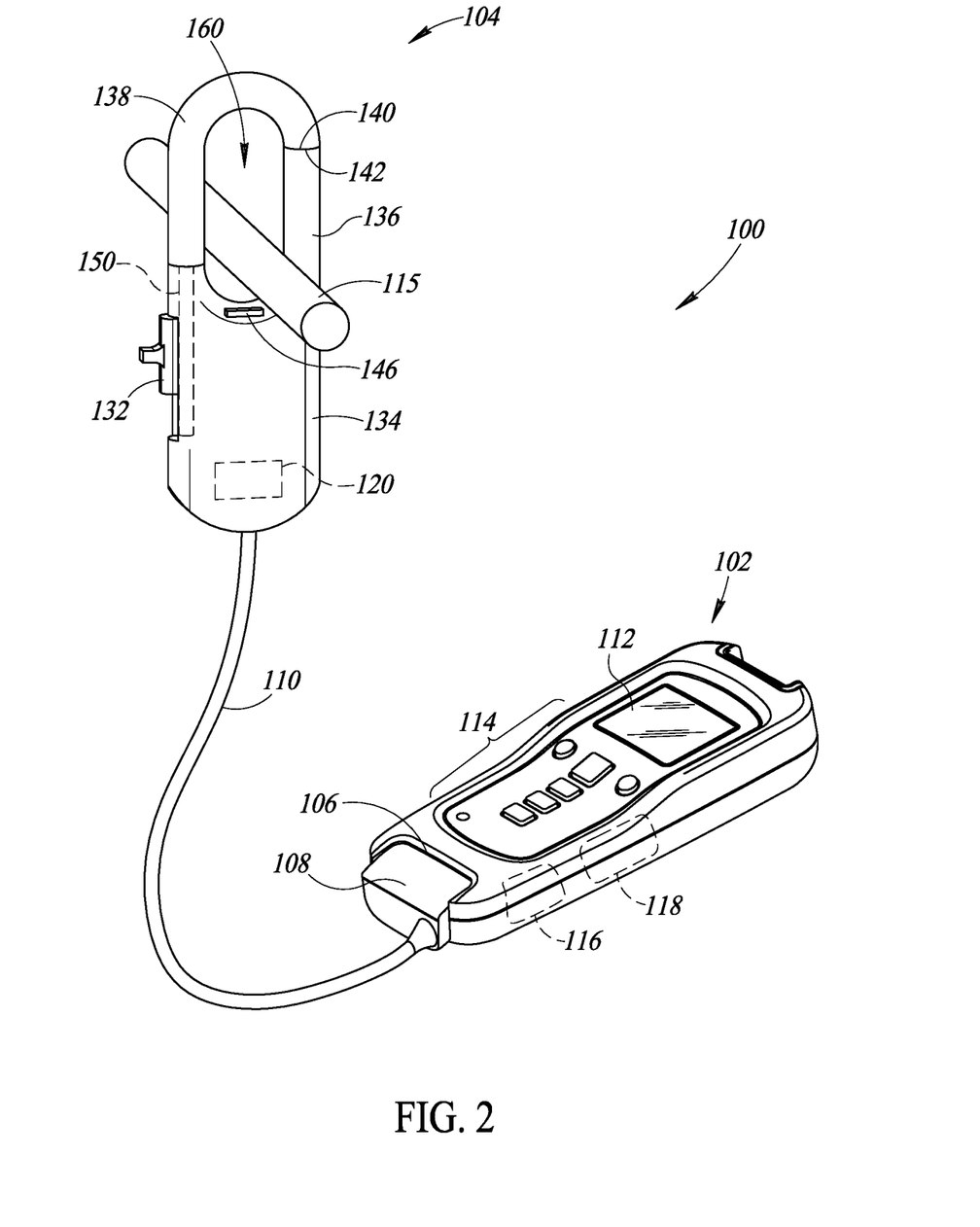
FIG. 2 is a pictorial diagram of the electrical parameter measurement device of FIG. 1, shown with the measurement loop closed around an insulated conductor under test to position the conductor proximate the non-contact sensor, according to one non-limiting illustrated implementation.

FIGS. 1 and 2 show pictorial diagrams of an electrical parameter measurement device 100, according to one non-limiting illustrated implementation. The electrical parameter measurement device 100 includes a main body or housing 102 and an electrical parameter sensor probe 104. The sensor probe 104 comprises a body 134 coupled to an interface connector 108 via a cable 110. The main body 102 includes an interface connector 106 that detachably couples with the corresponding interface connector 108 of the sensor probe 104.

The main body 102 further includes a display 112 that presents measurement results and other information, and an input user interface 114 for inputting information such as measurement instructions or other information. The display 112 may be a display of any suitable type, such as a liquid crystal display (LCD), a light-emitting diode (LED) display, an organic LED display, a plasma display, or an e-ink display. The main body 102 may include one or more audio or haptic outputs (not shown), such as one or more speakers, buzzers, vibration devices, etc. In the illustrated implementation, the input user interface 114 comprises a plurality of buttons, but in other implementations the user interface may additionally or alternatively include one or more other types of input devices, such as a touch pad, touch screen, wheel, knob, dial, microphone, etc.

The main body 102 may also include a power supply, such as a battery or battery pack, for supplying power to the various components of the main body and the sensor probe 104. The main body 102 also includes control circuitry 116 that controls the various operations of the electrical parameter measurement device 100, such as receiving signals from the sensor probe 104, determining one or more electrical parameters of an insulated conductor 115 under measurement, and outputting measurement data (e.g., to the display 112). The control circuitry 116 may include one or more processors (e.g., microcontroller, DSP, ASIC, FPGA), one or more types of memory (e.g., ROM, RAM, flash memory, other nontransitory storage media), and/or one or more other types of processing or control related components.

In at least some implementations, the main body 102 may include a wireless communications subsystem 118, which may include one or more of a Bluetooth® module, a Wi-Fi® module, a ZIGBEE® module, a near field communication (NFC) module, etc. The main body 102 may be operative to communicate wirelessly via the wireless communications subsystem 118 with an external receiving system, such as a computer, smart phone, tablet, personal digital assistant, etc., so as to transmit measurement results to the external system or to receive instruction signals or input information from an external system. The main body 102 may additionally or alternatively include a wired communications subsystem, such as a USB interface, etc.

Although only one sensor probe 104 is shown for explanatory purposes, in at least some implementations, a plurality of different sensor probes may be detachably coupleable to the main body 102 of the electrical parameter measurement device 100. The plurality of sensor probes may differ in at least one of shape, structure, or function, for example, to provide various functionality for the electrical parameter measurement device 100.

The sensor probe 104 includes a flexible arm 138 coupled to the body 134. The flexible arm 138 is movable between a closed position (shown in FIG. 2) and an open position (shown in FIG. 1). In the closed position shown in FIG. 2, an end portion 140 of the flexible arm 138 abuts an end portion 142 of a fixed arm or portion 136 of the body 134 to form an enclosed measurement loop that defines a measurement area 160 (FIG. 2) that receives the insulated conductor 115. In the open position shown in FIG. 1, the flexible arm 138 opens at least a portion of the measurement loop by separating the end 140 of the flexible arm 138 from the end 142 of the fixed arm 136 to allow the insulated conductor 115 to move into and out of the measurement area 160.

The sensor probe 104 also includes an actuator 150 operatively coupled to the flexible arm 138. The actuator 150 may include a slide switch 132 or other mechanism that is movable by a user. In operation, responsive to actuation by the user, the actuator 150 moves the flexible arm 138 from the closed position to the open position.

In at least some implementations, the actuator 150 biases the flexible arm 138 in the closed position shown in FIG. 2. For example, the actuator 150 may include a biasing element (e.g., a spring) that biases the flexible arm 138 in the closed position and biases the slide switch 132 in the upward position shown in FIG. 2. In such instances, the user may move the flexible arm 138 from the closed position into the open position by moving the slide switch 132 downward (as shown). While the user is maintaining the slide switch 132 in the downward position against the biasing force, the user may insert the insulated conductor 115 into the measurement area 160. The user may then release the slide switch 132, such that the biasing force of the actuator 150 causes the flexible arm 138 to return to the closed position, thereby securing the insulated conductor 115 within the measurement area 160 so that a measurement may be obtained. Once the measurement(s) has been obtained, the user may again move the flexible arm 138 into the open position to release the conductor 115 from the measurement area 160 of the sensor probe 104.

In at least some implementations, the flexible arm 138 is formed from a unitary structure that is deformable between the closed position and the opened position. For example, at least a portion of the flexible arm 138 may be formed from an elastomer or other material that elastically deforms between the closed position wherein the ends 140 and 142 abut each other and the open position wherein the ends 140 and 142 are spaced apart by a distance sufficient for the insulated conductor 115 to be moved into the measurement area 160. In other implementations, the flexible arm 138 may include a plurality of portions (e.g., "links") that are movable with respect to each other. In such implementations, the actuator 150 may be operative to selectively move the plurality of portions relative to each other to move the flexible arm 138 between the closed position and the open position.

In at least some implementations, the body 134 of sensor probe 104 includes one or more non-contact sensors 146 (e.g., a non-contact voltage sensor) coupled thereto that are operative to sense one or more electrical parameters in an insulated conductor 115 under test. Additionally or alternatively, one or more non-contact sensors 146 may be coupled to the flexible arm 138. The non-contact sensor 146 may be electrically connected to the signal cable 110 such that signals from the sensor are sent to the main body 102 for processing. The non-contact sensors may include a non-contact voltage sensor, a Hall Effect element, a current transformer, a fluxgate sensor, a Rogowski coil, an anisotropic magnetoresistance (AMR) sensor, a giant magnetoresistance (GMR) sensor, other types of sensors operative to sense an electrical parameter of the conductor 115 without requiring galvanic contact, or any combination thereof. Various non-limiting examples of non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The sensor probe 104 may also include processing or control circuitry 120 operatively coupled to the one or more sensors 146 that is operative to process sensor signals received from the one or more sensors 146, and is operative to send sensor data indicative of such sensor signals to the control circuitry 116 of the main body 102 for processing. The control circuitry 120 may additionally or alternatively include conditioning or conversion circuitry that is operative to condition or convert the signals into a form receivable by the main body 102, such as an analog form (e.g., 0-1 V) or a digital form (e.g., 8 bits, 16 bits, 64 bits).

In at least some implementations, in operation, the control circuitry 120 of the sensor probe 104 transmits measurement data from the sensor(s) 146 to the main body 102 of the electrical parameter measurement device 100, and the control circuitry 116 determines one or more electrical parameters in the conductor 115 based on the received measurement data. For example, the control circuitry 116 may utilize one or more mathematical formulas, lookup tables, calibration factors, etc., to determine the one or more electrical parameters. Further, some electrical parameters, such as power or phase angles, may be derived from other determined electrical parameters, such as current and voltage.

As noted above, the interface connector 108 may be detachably coupled with the corresponding interface connector 106 on the main body 102 of the electrical parameter measurement device 100, for example, such that different sensor probes may be coupled to the main body 102. In at least some implementations, the interface connector 108 of the sensor probe 104 may be configured as one of a plug and a socket, and the interface connector 106 of the main body 102 may be configured as the other of a plug and socket. In other implementations, the interface connectors 106 and 108 may be configured as different types of connectors that are operative to be detachably coupled to each other. Further, in some implementations, the sensor probe 104 may be fixedly connected to the main body 102 by the cable 110.

Figure 3:
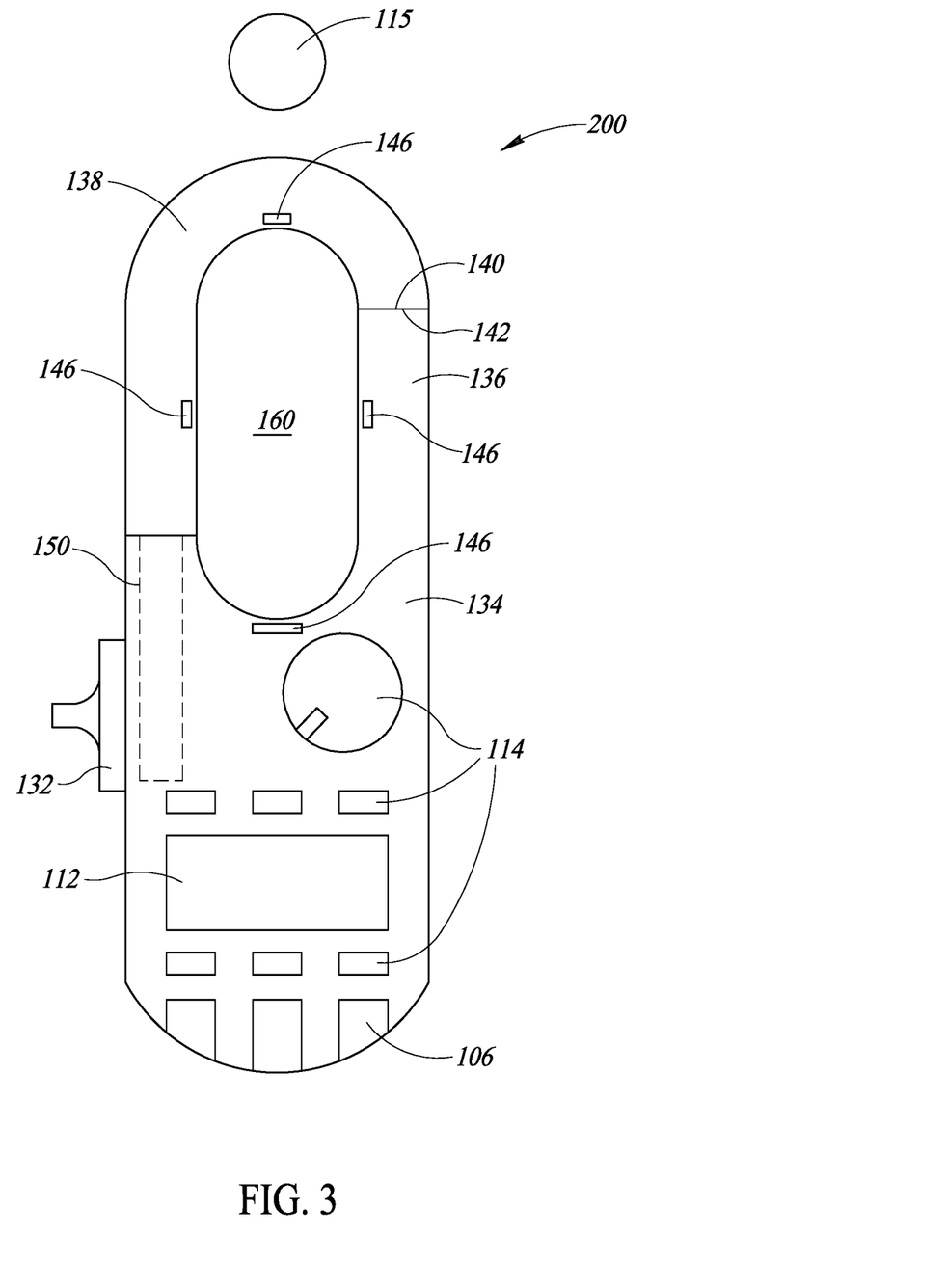
FIG. 3 is a pictorial diagram of an electrical parameter measurement device that includes a flexible arm that moves between a closed position and an open position, shown with the flexible arm in the closed position and an insulated conductor under test positioned outside of a measurement area, according to one non-limiting illustrated implementation.
Figure 4:
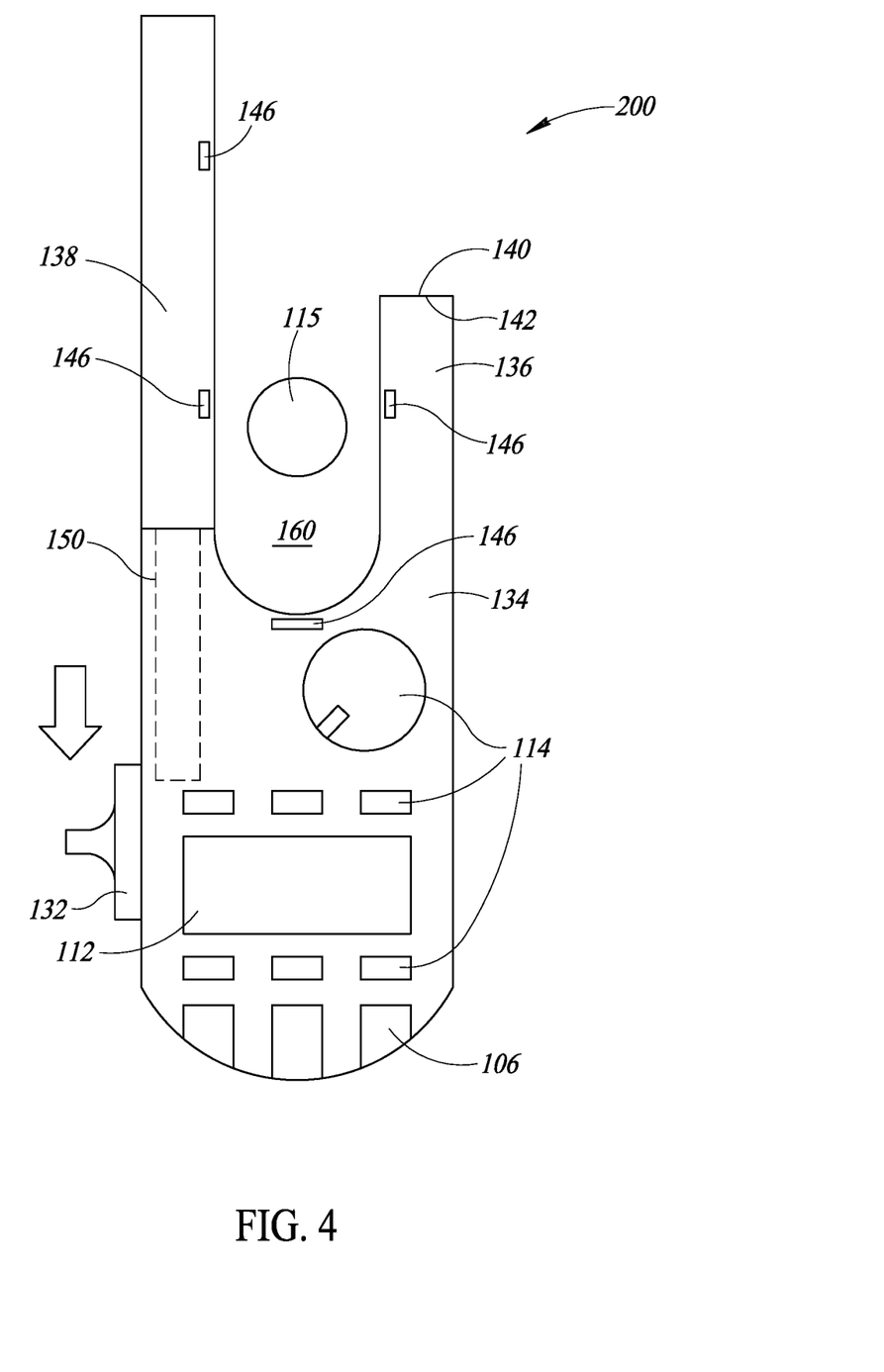
FIG. 4 is a pictorial diagram of the electrical parameter measurement device of FIG. 3, shown with the flexible arm in the open position to allow the conductor under test to be moved into the measurement area of the electrical parameter measurement device, according to one non-limiting illustrated implementation.
Figure 5:
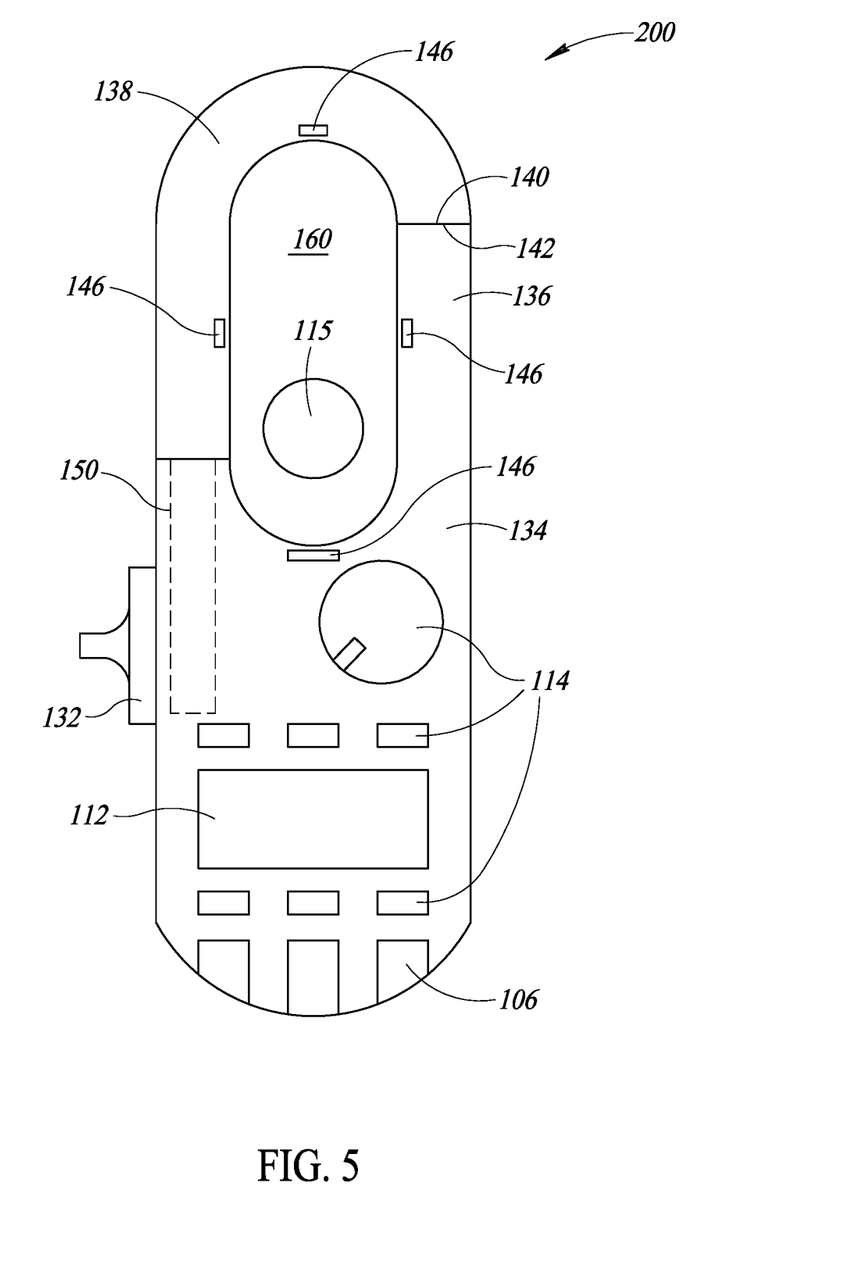
FIG. 5 is a pictorial diagram of the electrical parameter measurement device of FIG. 3, shown with the flexible arm in the closed position and the insulated conductor positioned inside the measurement area proximate the non-contact sensor, according to one non-limiting illustrated implementation.

FIGS. 3-5 show another implementation of an electrical parameter measurement device 200 in accordance with the present disclosure. The electrical parameter measurement device 200 may be similar or identical to the electrical parameter measurement device 100 discussed above in many respects. Thus, the discussion above may apply to the electrical parameter measurement device 200. Further, components of the electrical parameter measurement device 200 that are similar or identical to corresponding components of the electrical parameter measurement device 100 are designated with the same reference numerals, and a discussion of such components in not repeated herein for the sake of brevity.

Different from the electrical parameter measurement device 100 which includes the sensor probe 104 that is connectable to the main body 102 via the cable 110, in the electrical parameter measurement device 200, the sensor probe portion and the main body portion are contained in a single housing 134. FIG. 3 shows the electrical parameter measurement device 200 when the flexible arm 138 is in the closed position prior to inserting the insulated conductor 115 into the measurement area 160. FIG. 4 shows the electrical parameter measurement device 200 when the user has pressed down (as shown) on the slide switch 132 to cause the actuator 150 to move the flexible arm 138 into the open position, wherein the conductor 115 can be positioned in the measurement area 160. FIG. 5 shows the electrical parameter measurement device 200 when the user has released the slide switch 132, or moved the slide switch upward in cases where the slide switch is not biased upward, which causes the actuator 150 to cause the flexible arm 138 to return to the closed position, thereby securing the conductor 115 in the measurement area.

Once in the measurement area 160, the electrical parameter measurement device 200 may utilize non-contact sensors 146 to measure one or more electrical parameters (e.g., voltage, current, power, phase angle) of the insulated conductor 115. In the illustrated implementation, the electrical parameter measurement device 200 includes four non-contact sensors 146. In particular, the electrical parameter measurement device 200 includes two non-contact sensors 146 positioned on the flexible arm 138, one non-contact sensor on the fixed arm 136 of the body 134, and one non-contact sensor on a portion of the body proximate the bottom of the measurement area 160. In operation, the electrical parameter measurement device 200 may utilize one, some, or all of the non-contact sensors 146 to determine one or more electrical parameters of the insulated conductor. Further, it should be appreciated that although four non-contact sensors 146 are shown, in other implementations fewer or more non-contact sensors may be used to provide the desired functionality. Additionally, the non-contact sensors 146 may be positioned differently, so long as they are able to detect or measure electrical parameters in the insulated conductor 115 when the conductor is positioned in the measurement area 160. As noted above, the non-contact sensors may include one or more of a non-contact voltage sensor, a Hall Effect element, a current transformer, a fluxgate sensor, a Rogowski coil, an anisotropic magnetoresistance (AMR) sensor, a giant magnetoresistance (GMR) sensor, other types of sensors operative to sense an electrical parameter of the conductor 115 without requiring galvanic contact, or any combinations thereof.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter sensor probe operative to detect an electrical parameter in an insulated conductor without requiring galvanic contact with the insulated conductor, the electrical parameter sensor probe comprising:
a body;
a flexible arm and a fixed arm coupled to the body, the flexible arm being deformable between a closed position and an open position, wherein, in the closed position, an end portion of the flexible arm contacts an end portion of the fixed arm to form an enclosed measurement loop that defines a measurement area that receives the insulated conductor and, in the open position, the end portion of the flexible arm is spaced apart from the end portion of the fixed arm to allow the insulated conductor to move into and out of the measurement area;
an actuator operatively coupled to the flexible arm, the actuator configured to selectively deform the flexible arm between the closed position and the open position; and
at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area.

2. The electrical parameter sensor probe of claim 1, wherein the actuator biases the flexible arm in the closed position.

3. The electrical parameter sensor probe of claim 1, wherein the flexible arm comprises a plurality of portions that are movable with respect to each other, and the actuator is operative to move the portions relative to each other to deform the flexible arm between the closed position and the open position.

4. The electrical parameter sensor probe of claim 3, wherein the plurality of portions comprise links that are movable with respect to each other.

5. The electrical parameter sensor probe of claim 1, wherein the flexible arm has a curved shape when the flexible arm is in the closed position, and the actuator causes the flexible arm to straighten from the curved shape to be in the open position.

6. The electrical parameter sensor probe of claim 1, wherein the at least one non-contact sensor comprises at least one of a non-contact voltage sensor or a non-contact current sensor.

7. The electrical parameter sensor probe of claim 1, wherein the at least one non-contact sensor is coupled to the flexible arm.

8. The electrical parameter sensor probe of claim 1, wherein the at least one non-contact sensor comprises at least one non-contact sensor coupled to the flexible arm and at least one non-contact sensor coupled to the body of the electrical parameter sensor probe.

9. The electrical parameter sensor probe of claim 1, further comprising an interface connector operatively coupled to the at least one non-contact sensor, the interface connector being detachably coupleable to a corresponding interface connector of a main body of a non-contact electrical parameter measurement device.

10. The electrical parameter sensor probe of claim 1 wherein the at least one non-contact sensor comprises at least one of a non-contact voltage sensor, a Hall Effect sensor, a fluxgate sensor, a Rogowski coil, an anisotropic magnetoresistance (AMR) sensor, or a giant magnetoresistance (GMR) sensor.

11. A device for measuring an electrical parameter in an insulated conductor, the device comprising:
  an electrical parameter sensor probe, comprising:
    a body;
    a flexible arm and a fixed arm coupled to the body, the flexible arm being deformable between a closed position and an open position, wherein, in the closed position, an end portion of the flexible arm contacts an end portion of the fixed arm to form an enclosed measurement loop that defines a measurement area that receives the insulated conductor and, in the open position, the end portion of the flexible arm is spaced apart from the end portion of the fixed arm to allow the insulated conductor to move into and out of the measurement area;
    an actuator operatively coupled to the flexible arm, the actuator configured to selectively deform the flexible arm between the closed position and the open position; and
    at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area; and
  control circuitry communicatively coupleable to the at least one non-contact sensor, in operation, the control circuitry:
    receives sensor data indicative of signals detected by the at least one non-contact sensor; and
    processes the received sensor data to determine at least one electrical parameter of the insulated conductor.

12. The device of claim 11, further comprising a main body that contains the control circuitry.

13. The device of claim 12, wherein the main body comprises at least one interface connector, and the electrical parameter sensor probe is detachably connectable to the at least one interface connector of the main body.

14. The device of claim 11, further comprising a main body that includes the electrical parameter sensor probe and the control circuitry.

15. The device of claim 11, wherein the control circuitry, in operation, processes the received sensor data to determine a voltage in the insulated conductor.

16. The device of claim 11, wherein the control circuitry, in operation, processes the received sensor data to determine a voltage and a current in the insulated conductor.

17. The device of claim 11, further comprising:
  a wireless communications subsystem operatively coupled to the control circuitry, in operation, the wireless communication subsystem wirelessly transmits the determined electrical parameter to an external system.

18. The device of claim 11, further comprising:
  a display that, in operation, visually presents the determined electrical parameter to a user of the device.

19. The device of claim 11 wherein the at least one non-contact sensor comprises at least one of a non-contact voltage sensor, a Hall Effect sensor, a fluxgate sensor, a Rogowski coil, an anisotropic magnetoresistance (AMR) sensor, or a giant magnetoresistance (GMR) sensor.

20. A device for measuring an electrical parameter in an insulated conductor, the device comprising:
  a body;
  a flexible arm and a fixed arm coupled to the body, the flexible arm being deformable between a closed position and an open position, wherein, in the closed position, an end portion of the flexible arm contacts an end portion of the fixed arm to form an enclosed measurement loop that defines a measurement area that receives the insulated conductor and, in the open position, the end portion of the flexible arm is spaced apart from the end portion of the fixed arm to allow the insulated conductor to move into and out of the measurement area;
  an actuator operatively coupled to the flexible arm, the actuator configured to selectively deform the flexible arm between the closed position and the open position;
  at least one non-contact sensor coupled to at least one of the body and the flexible arm, the at least one non-contact sensor positioned proximate the measurement area and operative to sense at least one electrical parameter in the insulated conductor when the insulated conductor is positioned within the measurement area; and
  control circuitry communicatively coupleable to the at least one non-contact sensor, in operation, the control circuitry:
    receives sensor data indicative of signals detected by the at least one non-contact sensor;
    processes the received sensor data to determine at least one electrical parameter of the insulated conductor; and
    provides the determined at least one electrical parameter to at least one of a user or an external device.

* * * * *

UNITED STATES PATENT AND TRADEMARK OFFICE
CERTIFICATE OF CORRECTION

PATENT NO. : 10,908,188 B2  
APPLICATION NO. : 15/977148  
DATED : February 2, 2021  
INVENTOR(S) : Ferdinand Y. Laurino et al.

Page 1 of 1

It is certified that error appears in the above-identified patent and that said Letters Patent is hereby corrected as shown below:

On the Title Page

Page 2, Item (56), References Cited, Other Publications, Column 2, Reference 3 in the Column:
"Fluke Corporation, "Clamp Meter Service Information," downloaded on Feb. 7, 2018 from" should read, --Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.--.

Signed and Sealed this
Twenty-sixth Day of October, 2021

Drew Hirshfeld  
*Performing the Functions and Duties of the*  
*Under Secretary of Commerce for Intellectual Property and*  
*Director of the United States Patent and Trademark Office*